United States Patent [19]

Weed

[11] Patent Number: 4,716,097

[45] Date of Patent: Dec. 29, 1987

[54] INCREASED PHOTOPOLYMER PHOTOSPEED EMPLOYING YELLOW LIGHT PREEXPOSURE

[75] Inventor: Gregory C. Weed, Towanda, Pa.

[73] Assignee: E. I. Du Pont de Nemours and Company, Wilmington, Del.

[21] Appl. No.: 830,509

[22] Filed: Feb. 3, 1986

[51] Int. Cl.[4] .......................... G03C 5/00; G03C 5/04
[52] U.S. Cl. .................................. 430/327; 430/394; 430/494; 522/2; 522/913
[58] Field of Search .................. 430/327, 394, 494; 522/4, 913

[56] References Cited

U.S. PATENT DOCUMENTS

| | | | |
|---|---|---|---|
| 3,144,331 | 8/1964 | Thommes | 430/494 |
| 3,598,584 | 8/1971 | Rust et al. | 96/35.1 |
| 3,859,091 | 1/1975 | Wessells et al. | 430/327 X |
| 4,182,665 | 1/1980 | Mibu et al. | 522/4 |

OTHER PUBLICATIONS

*Color Index,* Third Edition, vol. 4, The Society of Dyers and Colorists, Bradford, Yorkshire, England, 1971, p. 4379.

Julius Grant, ed., *Hackh's Chemical Dictionary,* Third Ed., McGraw-Hill Book Company, Inc., 1944, p. 488.

Klemchuk, "Influence of Pigments on the Light Stability of Polymers: A Critical Review", Polymer Photochemistry, 3, (1983), 1-27.

*Primary Examiner*—Paul R. Michl
*Assistant Examiner*—Cynthia Hamilton

[57] ABSTRACT

Photopolymerizable composition comprising monomer, photoinitiator and triarylmethane or xanthene dye exhibit increased photospeed with an exposure to light above 400 nm with an intensity of at least 1500 lumen/sq. meter for one hour or more, with a preferred exposure of 15,000 lumen/sq. meter for 10 seconds or longer. A photospeed layer protected from exposure to oxygen has been shown to continue to maintain increased photospeed.

27 Claims, No Drawings

INCREASED PHOTOPOLYMER PHOTOSPEED EMPLOYING YELLOW LIGHT PREEXPOSURE

FIELD OF THE INVENTION

The present invention relates to an improved process for increasing photospeed of a photopolymer composition. In particular the present invention provides higher photospeed with a preexposure of high intensity yellow light.

BACKGROUND OF THE INVENTION

In the photopolymer field where ultraviolet light is used to expose a photopolymer composition, it has been common to illuminate the workroom in yellow light for work to proceed under relatively high visibility. Work under yellow light with photopolymer films has been equivalent to work under red lights with silver halide films, except that higher roomlight visibility is standard for photopolymer films.

It had long been recognized that undesirable reactions take place with photopolymer compositions which require corrective measures. Thommes U.S. Pat. No. 3,144,331 teaches a preexposure step employing at least 70% of the intensity of actinic radiation required to expose a photopolymer film as a means of restoring or photoconditioning a photopolymer film to its full potential for photopolymerization. Rust et al. U.S. Pat. No. 3,598,584 discloses a presensitizing step for a photopolymer film with actinic radiation of relatively low intensity as compared to that employed in the imaging step.

Peter P. Klemchuk, *Influence of Pigments on the Light Stability of Polymers; A Critical Review,* Polymer Photochemistry 3 (1983) 1-27 deals with interactions which occur in pigment polymer mixtures. Among the possible mechanisms discussed to explain some of the complex interactions are singlet and triplet state transitions. In particular light absorbing dyes are capable of energy transfers whereby singlet oxygen was produced.

In spite of all that was known concerning the effect of dyes and the deficiencies of photopolymer films, there has been no recognition that a beneficial effect could be obtained by correctly regulating preparation and exposure of a photopolymer film with a combination of a specific class of dyes in the photopolymer composition and use of actinic radiation of a wavelength normally employed to prevent undesirable reactions.

SUMMARY OF THE INVENTION

The present invention is directed to a process of increasing the photospeed of a photopolymerizable composition with subsequent exposure to actinic radiation, said photopolymerizable composition containing
(a) an addition polymerizable ethylenically unsaturated monomer,
(b) an initiating system activated by actinic radiation, and
(c) a triarylmethane or xanthene dye
wherein the process comprises
(1) exposing the photopolymerizable composition to radiation at a wavelength above 400 nm and at an intensity of at least 1500 lumen per square meter for a time sufficient to increase photospeed and
(2) imagewise exposing the photopolymerizable composition with increased photospeed from step (1) to actinic radiation.

DETAILED DESCRIPTION OF THE INVENTION

The starting materials for the process of the present invention of an addition polymerizable ethylenically unsaturated monomer and an initiating system activated by actinic radiation are well known in the art. The use of a dye likewise is conventional in a photosensitive composition. However criticality is present in the type of dye employed to obtain the advantages of an increase in photospeed employing the critical process step of preexposure in the manner disclosed herein.

The dye which is required is selected from the class of triarylmethane or xanthene. Suitable triarylmethane dyes include C.I. No. 42595 victoria blue, C.I. No. 42000 basic green 4, C.I. No. 44045 basic blue 26 C.I. No. 42000 victoria green. Suitable xanthene dyes include C.I. No. 45170 basic violet (Rhodamine B), C.I. No. 45380 acid red 87 (eosin Y), C.I. No. 45440 acid red 94 (rose bengal. C.I. No. 45160) basic red 1. While it is not known with certainty, it is believed that these dyes function within the photopolymer composition to convert oxygen to its singlet state.

With the critical components of an addition polymerizable ethylenically unsaturated monomer, an initiating system activated by actinic radiation and a triarylmethane or xanthene dye, the advantage of an increase in photospeed of the photopolymer composition can be realized employing the process steps of preexposure to actinic radiation of a necessary wavelength. It is essential that preexposure of the composition take place with light having a wavelength of at least 400 nm. Generally the wavelength will have an upper limit of 800 nm and more preferably not greater than 700 nm. A preferred wavelength range is from 400 nm to 800 nm and more preferably from 430 nm to 700 nm.

The wavelength of actinic radiation employed herein is inclusive of yellow light which is conventionally employed in processing of photopolymer compositions. However such light normally employed as background lighting is not of sufficient intensity to obtain the useful result of photospeed obtained herein. In a laboratory designed for working with photopolymer compositions a typical lighting intensity which allows for comfortable yellow light levels is on the order of 860 lumen/sq. meter. Under this light level photopolymer compositions are mixed, coated and examined in the way silver halide emulsions and films are normally handled in red light darkrooms.

When an intensity of 1500 lumen/sq. meter is applied to a photopolymer composition containing a triarylmethane or xanthene dye or both of these dyes for a period of 1 to 2 hours an increase in photospeed is observed within the disclosed wavelength range relative to samples of the same film left exposed to yellow room light of 860 lumen/sq. meter for 24 hours. With an intensity of. e.g., of at least 3,000 or 5,000 lumen/square meter, shorter exposure times are suitable. With an exposure to nonactinic yellow light with an intensity of 15,000 lumen/sq. meter for as little as 10 seconds, the same film which was substantially unaffected in yellow room light can be significantly increased in photospeed. Thus the lack of response to yellow roomlight exposure clearly indicates that a threshold of exposure intensity is present. Within the present invention, higher intensity exposure can be used to compensate for operative range of time of exposure. As measured by developed steps on a sixth root of two step wedge exposed film, the minimum increase in photospeed will be at least 2 to 3 steps and more generally at least 3 to 12 steps. However, it may be possible to obtain photospeed increases of at least 15 steps.

An advantage provided by the present invention is that the process may be automated where the high intensity yellow light exposure is included in the design of equipment for machine handling of sheets or rolls of photopolymer elements. Also, since the yellow light exposure is nonactinic and nonimagewise it can be combined with other steps such as lamination or delamination prior to an imagewise actinic exposure such as exposure to actinic radiation.

Another advantage of the present invention is that the photopolymerizable element does not reach its maximum photosensitivity until exposed to nonactinic radiation at least 400 nm and an intensity of at least 1500 lumen/sq. meter. Thus, during manufacture, storage and preparation for use the photopolymer element is less sensitive to stray radiation than it is just prior to imagewise exposure.

The present of oxygen, i.e., air has been found to reverse the effects of exposure to yellow light if the photopolymer composition is stored. However, an advantage of the present process is that the effect of oxygen has been found to be reversible. Illustratively if the photopolymerizable composition is not employed within a short time after exposure to yellow light, e.g., an hour or two and stored prior to exposure to actinic radiation, a significant decrease in photospeed will result which will approach or equal the original photospeed. However a reexposure to yellow light in the manner previously described is possible to again obtain an increase in photospeed.

An alternate technique of obtaining an increase in photospeed after exposure to yellow light is to maintain the photopolymerizable composition separate from significant contact with oxygen. One method is to employ a material which has a degree of impermeability to the passage of oxygen. An increase in protection is obtained with a more impermeable barrier to this gas. Where the photopolymer composition is coated on a support, the barrier layer may include, for example, polyethylene terephthalate. resin or gelatin coated polyethylene terephthalate, cellulose acetate, plastic or metal. In the case where the support is a plastic which is more permeable to oxygen than polyethylene terephthalate it is desirable to coat the plastic with an oxygen impermeable layer. This layer may comprise gelatin, gum arabic, polyvinyl alcohol polyacrylonitrile or similar synthetic polymer. Hydrolyzed polyvinyl alcohol is especially suitable for use as an oxygen impervious layer above or under a layer containing triarylmethane or xanthene dye. In an automated process where photopolymer element would receive an actinic exposure directly after the yellow light exposure there is no need to provide an oxygen impervious layer.

As previously discussed components of the photopolymer composition are well known in the prior art including an addition polymerizable ethylenically unsaturated monomer and an initiating system activated by actinic radiation. Also a thermal polymerization inhibitor is normally employed which is conventional in the prior art.

The photopolymer composition can be present as a liquid or in a preferred mode can be used as a film such as coated on a support. A photopolymer film would conventionally contain a polymeric binder.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(phydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropl) ether of tetrabromo-bisphenol-A, di-(2-methacryloxyethyl) ether of tetrabromobisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers include alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers: α-hydrocarbon-substituted aromatic acyloins, including α-methylbenzoin, α-allylbenzoin and α-phenylbenzoin. Photoreducible dyes and reducing agents disclosed in U.S. Pat. Nos.: 2,850,445; 2,875,047; 3,097,096; 3,074,974; 3,057,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride. 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Suitable binders which can be used alone, if employed, or in combination with one another include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers: polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula HO(CH$_2$)$_n$OH, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

For aqueous development the binder should contain sufficient acidic or other groups to render the composition processible in aqueous developer. The term processible in aqueous developer means. Useful aqueous-processible binders include those disclosed in U.S. Pat. No. 3,458,311 and in U.S. Pat. No. 4,273,857. Useful amphoteric polymers include interpolymers derived from N-alkylacrylamides or methacrylamides, acidic film-forming comonomer and an alkyl or hydroxyalkyl acrylate such as those disclosed in U.S. Pat. No. 4,293,635. For aqueous development the photosensitive layer will be removed in portions which are not exposed to radiation but will be substantially unaffected during development by a liquid such as wholly aqueous solutions containing 2% sodium carbonate by weight.

A wide range of photopolymerizable compositions may be used in the practice of the present invention both in liquid and film form. These include photoresists, solder masks, innerlayers, printing plates, proofing films and films for continuous or automated processes. Examples of prior art disclosure of suitable compositions (including the presence of the dye discussed herein) are U.S. Pat. Nos. 3,469,982; 3,547,730; 3,526,504 and 4,293,635 as well as numerous other publications. In these processes the photopolymerizable compositions are imagewise exposed to radiation, i.e., selected portions of the compositions are exposed.

The following examples serve to illustrate the present invention. All parts and percentages are by weight and degrees are in centigrade unless otherwise indicated. Example 1 illustrates the best mode.

EXAMPLE 1

A photopolymer composition was prepared containing the following ingredients:

| | |
|---|---|
| Polymer binder MMA/EA/MAA (51/29/20) Tg = 87°, acid number 127, mol. wt. 45,000 | 62.5 |
| Ethyl p-dimethylamino benzoate available from Aceto Chemical | 2.0 |
| Polymer of ethylene oxide mol. wt. 400,000 | 0.5 |
| Ethoxylated trimethylol propane triacrylate | 25.0 |
| Diacrylated polyurethane based upon hydroxyethylacrylate toluene diisocyante, and polypropylene glycol | 4.0 |
| Michler's ketone | 0.15 |
| Benzophenone | 5.2 |
| Leuco Crystal Violet 4,4',4" methylidyne tris-N,N dimethylaniline | 0.3 |
| Diethylhydroxylamine | 0.2 |
| 4-Trichloromethyl-4-methyl-cyclohexadienone | 0.1 |
| Victoria Green dye C.I. No. 42000 | 0.04 |
| Victor Blue dye C.I. No. 42595 | 0.02 |
| MMA is methylmethacrylate EA is ethylacrylate MAA is methacrylic acid | |

The composition was dissolved in 93 percent methylene chloride/7 percent methanol and coated on a polyethylene terephthalate support and dried to produce an experimental photoresist film which would be developed in dilute alkali.

A control film was prepared in which the Victoria Green and Victor Blue dyes were omitted.

The control and experimental films were laminated to a Mylar ® polyethylene terephthalate coversheet and exposed using four 40 watt Sylvania Gold F40/60 fluorescent tubes. The exposure was measured using a General Electric Type 214 light meter. All films received an exposure of 27,000 lumen/sq. meter for 120 seconds. The films were then given an actinic exposure of 70 mj/cm$^2$ through a $^6\sqrt{2}$ Stouffer 41 stepwedge, the coversheet was removed and the images were developed in a 1 percent aqueous sodium carbonate solution. An examination of the developed stepwedges showed a one to twelve step increase for the dye containing film, but no speed increase for the control as a result of the yellow light exposure.

The control and experimental films were also laminated to copper and used as photoresists for etching. While the experimental film gave higher speed when preexposed with high intensity yellow light, the films otherwise gave equivalent performance in etching and stripping tests similar to those used for printed circuit board manufacture.

The test was repeated using an exposure of 1700 lumen/sq. meter for three hours. The experimental film showed a 2 to 6 step speed advantage, whereas the control showed no speed increase due to the nonactinic exposure.

EXAMPLE 2

Control and experimental films were compared as in Example 1 except that an azo dye Luxol Fast Blue was incorporated in the experimental films. A comparison of normally exposed and yellow light preexposed films as in Example 1 revealed no difference in photospeed. This illustrates this dye to be outside the scope of the present invention.

EXAMPLE 3

Photopolymer compositions were prepared as in Example 1 except that each experimental film contained 0.04 percent of one of the following dyes: Victoria Blue, Victoria Green or Rhodamine B.

Samples of the control and experimental films were laminated to a variety of surfaces including: unscrubbed copper, scrubbed copper, glass epoxy, polyvinyl alcohol coated copper, aluminum foil, nickel alloy foil and polyethylene terephthalate.

The laminated samples were then given the following different yellow light exposures before receiving an ultraviolet exposure at 65 mj/cm2; 24 hours under yellow room lights, 1500 lumen/sq. meter for 2 hours and 15,000 lumen/sq. meter for 15 seconds.

No difference was observed between control and experimental films for exposed and developed samples given the 24 hour yellow room light exposure before the actinic ultraviolet exposure through a stepwedge. The control showed no change in photospeed for either yellow light preexposure, whereas the films containing Victoria Green, Victoria Blue or Rhodamine B showed photospeed increases similar or greater than those of Example 1.

EXAMPLE 4

The composition of Example 1 was coated on a support and with no further treatment served as a control. A coating of the same composition was then overcoated with hydrolyzed polyvinyl alcohol to provide a clear top coat. When both films were given a high intensity yellow light exposure as in Example 1 and developed immediately afterwards, both films showed a higher photospeed than when they were only given the usual UV exposure before development. Then the control and overcoated films were given the high intensity yellow light exposure and then held for 24 hours before being UV exposed and developed. In this case the control without an oxygen impervious protective coating showed no photospeed advantage, whereas the topcoated film showed the same photospeed increase as when tested fresh.

EXAMPLE 5

Eight films were prepared as in Example 1 except that Leuco crystal violet, Victoria Green and Victoria Blue were varied according to a statistical design. Films 5 and 8 reproduce Example 1. The films were laminated to copper panels and one-half the panel was exposed to yellow light exposure. The exposed and unexposed portions of each panel was then given a 70 mj/cm$^2$ ultraviolet exposure through a stepwedge. Hold times after yellow light exposure and UV exposure were 10 minutes each. The panels were developed after removing the coversheet with 1% sodium carbonate at 29° C. The number of steps held on the yellow light exposed portion was compared with the number of steps held on the portion not exposed to yellow light. Table 1 gives results.

| Film | Leuco Crystal Violet | Victoria Blue | Victoria Green | Step Increase 16,000 lumen/sq.m. for 11 min. | 26,000 lumen/sq.m. for 2 min. |
|---|---|---|---|---|---|
| 1 | — | — | — | 1 | 0 |
| 2 | — | .02 | — | 15 | 12 |
| 3 | — | — | .04 | 8 | 3 |
| 4 | — | .02 | .04 | 12 | 10 |
| 5 | .3 | — | — | 1 | 0 |
| 6 | .3 | .02 | — | 14 | 9 |
| 7 | .3 | — | .04 | 3 | 1 |
| 8 | .3 | .02 | .04 | 11 | 4 |

Since zero to 1 step increase falls within the range of experimental error, these results show that Victoria Blue and Victoria Green and not leuco crystal violet contribute to the yellow light speed increase.

EXAMPLE 6

An evaluation was performed to determine if this yellow light exposure would be effective in automated equipment if no coversheet were present. The film of Example 1 was laminated to a support and the coversheet was removed. The film was immediately given a yellow light exposure of 26,000 lumen/sq. m. for 2 minutes which was followed directly by a 39 second 70 mj/cm$^2$ ultraviolet exposure and immediately developed. A control was held for 2 minutes without the yellow light exposure. A 2 step speed increase was observed for this experiment, but in the absence of a coversheet the edges of the stepwedge showed speed loss relative to the center of the stepwedge.

What is claimed is:

1. A process of increasing the photospeed of a layer of a photopolymerizable composition with subsequent exposure to actinic radiation, said photopolymerizable composition containing (a) an addition polymerizable ethylenically unsaturated monomer (b) an initiating system activated by actinic radiation, and (c) a triarylmethane or xanthene dye wherein the process comprises the steps of:

(1) exposing the layer of the photopolymerizable composition to radiation at a wavelength longer than 400 nm and at an intensity of at least 1500 lumen per square meter for a time sufficient to increase photospeed and (2) imagewise exposing the photopolymerizable composition with increased photospeed from step (1) to actinic radiation, with the proviso that the dye in (c) is chosen from a triarylmethane or xanthene dye capable of imparting an increase in photospeed of at least two steps as measured on a sixth root of two step wedge exposed film and with the proviso that such increase in photospeed is obtained in step (1).

2. The process of claim 1 wherein the increase in photospeed is at least 3 $^6\sqrt{2}$ steps.

3. The process of claim 2 wherein the increase in photospeed is at least 12 $^6\sqrt{2}$ steps.

4. The process of claim 3 wherein the increase in photospeed is as least 15 $^6\sqrt{2}$ steps.

5. The process of claim 1 wherein the radiation is at wavelength in the range from 400 nm to 800 nm.

6. The process of claim 5 wherein the wavelength is in the range from 430 nm to 700 nm.

7. The process of claim 1 wherein the time of exposure in step (1) is at least 10 seconds.

8. The process of claim 7 wherein the time of exposure is at least 2 minutes.

9. The process of claim 1 wherein the intensity of radiation is at least 3,000 lumens per square meter.

10. The process of claim 9 wherein said intensity of radiation is at least 15,000 lumens per square meter.

11. The process of claim 1 wherein substantially all surface area of the photopolymerizable composition is protected from direct exposure to oxygen during step (1).

12. The process of claim 1 wherein the dye is present in an amount of 0.005 to 0.5 percent by weight of the photopolymer composition.

13. The process of claim 12 wherein the dye is present in an amount of 0.01 to 0.1 percent by weight of the photopolymer composition.

14. The process of claim 13 wherein the dye selected from the group consisting of Victoria Green, Victoria Blue or Rhodamine B.

15. A process of increasing the photospeed of a supported layer of a photopolymerizable composition with subsequent exposure to actinic radiation, said photopolymerizable composition present as a film containing (a) an addition polymerizable ethylenically unsaturated monomer (b) an initiating system activated by actinic radiation (c) a polymeric binder, and (d) a triacrylmethane or xanthene dye wherein the process comprises the steps of (1) exposing the supported layer of the photopolymerizable composition to radiation at a wavelength longer than 400 nm at an intensity of at least 1500 lumen per square meter for a time sufficient to increase photospeed and (2) exposing the photopolymerizable photospeed from step (1) to actinic radiation to obtain portions of the composition which are exposed to actinic radiation and other portions which are unexposed, with the proviso that the dye in (d) is chosen for a triarylmethane or xanthene dye capable of imparting an increase in photospeed of at least two steps as measured on a sixth root of two step wedge exposed film and with the proviso that such increase in photospeed is obtained in step (1).

16. The process of claim 15 wherein the increase in photospeed is at least 3 $^6\sqrt{2}$ steps.

17. The process of claim 16 wherein the increase in photospeed is at least 12 $^6\sqrt{2}$ steps.

18. The process of claim 17 wherein the increase in photospeed is at least 15 $^6\sqrt{2}$ steps.

19. The process of claim 15 wherein the radiation is at wavelength in the range from 400 nm to 800 nm.

20. The process of claim 19 wherein the wavelength is in the range from 430 nm to 700 nm.

21. The process of claim 15 wherein the time of exposure in step (1) is at least 10 seconds.

22. The process of claim 21 wherein the time of exposure is at least 2 minutes.

23. The process of claim 15 wherein the intensity of radiation is at least 3,000 lumens per square meter.

24. The process of claim 23 wherein said intensity of radiation is at least 15,000 lumens per square meter.

25. The process of claim 15 wherein the dye is present in an amount of 0.005 to 0.5 percent by weight of the photopolymer composition.

26. The process of claim 25 wherein the dye is present in an amount of 0.01 to 0.1 percent by weight of the photopolymer composition.

27. The process of claim 26 wherein the dye selected from the group consisting of Victoria Green, Victoria Blue or Rhodamine B.

* * * * *

UNITED STATES PATENT AND TRADEMARK OFFICE
CERTIFICATE OF CORRECTION

PATENT NO. : 4,716,097

DATED : December 29, 1987

INVENTOR(S) : Gregory C. Weed

It is certified that error appears in the above-identified patent and that said Letters Patent is hereby corrected as shown below:

Column 10, line 14, insert after the word "photopolymerizable" insert -- composition with increased --.

Signed and Sealed this

Fourteenth Day of June, 1988

Attest:

DONALD J. QUIGG

*Attesting Officer*   *Commissioner of Patents and Trademarks*